United States Patent
Galambos et al.

(10) Patent No.: US 7,122,777 B2
(45) Date of Patent: Oct. 17, 2006

(54) IMAGE CAPTURE DEVICE, INCLUDING METHODS FOR ARRANGING THE OPTICAL COMPONENTS THEREOF

(75) Inventors: Tiberiu Galambos, Biniamina (IL); Eugene Fainstain, Netania (IL); Alex Shnayder, Zkhron-Ya'acov (IL); Yair Elmakias, Givat Olga (IL)

(73) Assignee: Transchip, Inc., Ramat—Gan (IL)

( * ) Notice: Subject to any disclaimer, the term of this patent is extended or adjusted under 35 U.S.C. 154(b) by 0 days.

(21) Appl. No.: 11/225,882

(22) Filed: Sep. 12, 2005

(65) Prior Publication Data

US 2006/0054786 A1 Mar. 16, 2006

Related U.S. Application Data

(60) Provisional application No. 60/608,972, filed on Sep. 10, 2004.

(51) Int. Cl.
*H01L 27/00* (2006.01)
*H01L 21/00* (2006.01)
*H01L 31/0232* (2006.01)

(52) U.S. Cl. .............. 250/208.1; 438/65; 257/432
(58) Field of Classification Search ............. 250/208.1; 438/65; 257/432
See application file for complete search history.

(56) References Cited

U.S. PATENT DOCUMENTS

| 5,578,837 | A | 11/1996 | Jackson et al. |
| 6,638,786 | B1 | 10/2003 | Yamamoto |
| 2001/0056337 | A1* | 12/2001 | Kurita ............................ 703/2 |
| 2003/0006363 | A1* | 1/2003 | Campbell et al. ......... 250/208.1 |
| 2004/0027474 | A1 | 2/2004 | Aoyama et al. |

FOREIGN PATENT DOCUMENTS

JP   1213079   *  8/1989

\* cited by examiner

*Primary Examiner*—Georgia Epps
*Assistant Examiner*—Brian Livedalen
(74) *Attorney, Agent, or Firm*—Townsend and Townsend and Crew LLP

(57) ABSTRACT

An image capture device includes a focusing lens, a light sensor array having a plurality of pixels arranged in a matrix of rows and columns and a plurality of optical components. Each optical component is configured to focus light on a light-sensing portion of one of the pixels. The locations of the optical components define a grid of parallel and perpendicular lines and a line spacing of the grid varies as a function of a distance from an optical axis of the focusing lens.

22 Claims, 10 Drawing Sheets

IMAGE CAPTURE DEVICE, INCLUDING METHODS FOR ARRANGING THE OPTICAL COMPONENTS THEREOF

CROSS-REFERENCES TO RELATED APPLICATIONS

This application is a non-provisional of, and claims the benefit of, co-pending, commonly assigned U.S. Provisional Patent Application No. 60/608,972, entitled "FINE MICROLENS SHIFT" filed on Sep. 10, 2004, which application is incorporated herein by reference for all purposes.

This application is related to co-pending, commonly assigned, U.S. patent application Ser. No. 10/474,798, entitled "CMOS IMAGER FOR CELLULAR APPLICATIONS AND METHODS OF USING SUCH", filed on Oct. 8, 2003, which is a nationalization of International Patent Application No. PCT/US02/17358, entitled "CMOS IMAGER FOR CELLULAR APPLICATIONS AND METHODS OF USING SUCH," filed on May 29, 2002, which application is a non-provisional of, and claims the benefit of, U.S. Provisional Application No. 60/294,388, entitled "CMOS IMAGER FOR CELLULAR APPLICATIONS," filed on May 29, 2001, the entire disclosure of each of which are incorporated herein for all purposes. This application is also related to the following co-pending, commonly assigned and concurrently filed U.S. applications, the entirety of each of which is included herein by reference: U.S. patent application No. 11/225,401, filed on Sep. 12, 2005, entitled "AN IMAGE CAPTURE DEVICE, INCLUDING METHODS FOR ARRANGING THE OPTICAL COMPONENTS THEREOF", and U.S. patent application No. 11/225,375, filed on Sep. 12, 2005, entitled "AN IMAGE CAPTURE DEVICE, INCLUDING METHODS FOR ARRANGING THE OPTICAL COMPONENTS THEREOF."

BACKGROUND OF THE INVENTION

The present invention relates generally to systems and methods for detecting and/or transmitting images. More particularly, the present invention relates to detecting and transmitting images in relation to a cellular telephone.

Focusing lenses of mobile image capture devices, such as CMOS-based digital cameras, are often not telecentric. Telecentric lenses are often too bulky for portable devices. Hence, a principle ray of the light at each pixel of a sensor array is not normal to the surface of the pixel. Moreover, the further a pixel is from the center of the array, the greater the angle of the principle ray varies from normal.

Pixels typically include a light sensor (e.g., photodiode or the like), a microlens that focuses incoming light on the light sensor, and a color filter. Pixels also may include one or more silicon dioxide layers, silicon nitride layers, planarization layers, and the like. Hence, the stackup of layers, which may have different refractive indexes and different thicknesses, complicate the problem. Essentially, the light must be redirected down and into a hole formed by the pixel layers.

Additionally, pixels are not light sensing throughout. The light sensitive portion of a pixel may be only a fraction of the pixel's area. Even if a microlens is positioned to focus light fully within the pixel area, some of the light may fall off the light sensitive region, leading to loss of signal. Further, the light may be obscured by metal wiring and the like as the light travels through the pixel.

Complicating the foregoing is the reality that production equipment, such as mask lithography equipment, is not infinitely variable. The equipment typically has a finite tolerance that prevents exact location of mask borders.

BRIEF SUMMARY OF THE INVENTION

Embodiments of the invention provide a method of determining a location of each of a plurality of optical components with respect to a plurality of pixels comprised by an array. The method includes providing the array of pixels. The array is generally planar and the pixels are arranged in columns and rows having a pitch. The method also includes providing a focusing lens having an optical axis normal to the array and placing each of the plurality of optical components in relation to the optical axis and an associated pixel. The optical components are grouped into matrices of adjacent optical components. Each matrix of optical components includes a first group having one or more of the optical components and a second group having one or more of the optical components. The optical components have a dimension. The dimension for the first group is a first value. The dimension for the second group is a second value. The first and second values are different.

In some embodiments, each matrix has an average pitch and the average pitch varies as a function of a radial distance of the matrix from the optical axis. The average pitch may vary in a linear relationship with respect to the optical axis. The optical components may be color filters. The optical components may be microlenses. Placing each of the plurality of optical components in relation to the optical axis and an associated pixel may include determining a location of each of the microlenses with respect to a location of one or more optical obstructions within its associated pixel. The at least one of the one or more optical obstructions may include metal wiring. The pixel array may be an array of CMOS sensors. The optical components may be comprised by an image capture device. The image capture device may be a mobile telephone.

In additional embodiments, a method of locating a plurality of optical components of an image capture device includes providing a focusing lens and providing an image sensor having an array of pixels having a pitch. The image sensor array is configured to capture an image focused by the focusing lens. The method also includes providing a plurality of optical components arranged in relation to the pixels. The plurality of optical components are arranged in matrices of the optical components. The matrices include optical components having at least two different sizes.

In some embodiments, the optical components are color filters. The optical components may be microlenses. The image sensor, optical components, and focusing lens may be comprised by an image capture device. The image capture device may be a mobile telephone. The array may be an array of CMOS sensors.

In still other embodiments, an image capture device includes a focusing lens and an image sensor having an array of pixels having a pitch. The image sensor array is configured to capture an image focused by the focusing lens. The device also includes a plurality of optical components arranged in relation to the pixels. The plurality of optical components are arranged in matrices of the optical components and the matrices include optical components having at least two different sizes.

In some embodiments, the optical components are color filters. The optical components may be microlenses. The image capture device may be a mobile telephone. The array may be an array of CMOS sensors.

In still other embodiments, a method of determining a location for each of a plurality of microlenses with respect to each of a plurality of pixels includes providing an image capture device having a focusing lens and a light sensor array comprising the plurality of pixels arranged in a matrix of rows and columns. Each microlens is configured to focus light on a light-sensing portion of one of the pixels. The method also includes determining a location of each of a first portion of the plurality of the microlenses along a diagonal axis of the pixel array. The diagonal axis is perpendicular to and intersects an optical axis of the focusing lens of the image capture device. The optical axis of the focusing lens is coincident with a normal axis of the pixel array. The method also includes determining a location of each of a second portion of the plurality of microlenses relative to the locations of the first portion of the plurality of microlenses along the diagonal axis. The locations of the microlenses define a grid of parallel and perpendicular lines. A line spacing of the grid varies as a function of a distance from the optical axis of the focusing lens.

In some embodiments, the line spacing decreases, across at least a portion of the array, as the distance increases. The line spacing may decrease as the distance increases in finite increments. The finite increments may relate to a mask resolution. The line spacing may increases, across at least a portion of the array, as the distance increases. The line spacing may increase as the distance increases in finite increments. The finite increments may relate to a mask resolution. The first and second portions of the plurality of pixels may be comprised by a first quadrant of the pixel array. The method may include determining a location of each of a third portion of the plurality of pixels comprised by a second quadrant of the pixel array. The locations of the pixels of the second quadrant of the pixel array may be symmetrical, about the normal axis, with respect to the first quadrant. The method also may include determining a location of each of a fourth portion of the plurality of pixels comprised by third and fourth quadrants of the pixel array. The locations of the pixels of the third and fourth quadrants of the pixel array may be symmetrical, about the normal axis, with respect to the first quadrant. Each pixel may include a first layer positioned between the light sensing portion of the pixel and the microlens. The line spacing may be a function of a refractive index and a thickness of the layer. Determining a location of each of a first portion of the plurality of the microlenses along a diagonal axis of the pixel array may include determining an equation that relates the location of the microlenses to a radial distance from the normal axis, determining a polynomial of order X that approximates the equation, using the polynomial to calculate a location of each microlens, and rounding the calculated location to a nearest increment. The increment may relate to a mask resolution used to produce the light sensor array. The order X may be in the range 2 to 10. The order X may be 3. The image capture device may be a mobile telephone. The array may be an array of CMOS sensors.

In still other embodiments, an image capture device includes a focusing lens, a light sensor array comprising a plurality of pixels arranged in a matrix of rows and columns, and a plurality of optical components, wherein each optical component is configured to focus light on a light-sensing portion of one of the pixels. The locations of the optical components define a grid of parallel and perpendicular lines. A line spacing of the grid varies as a function of a distance from an optical axis of the focusing lens.

In some embodiments, the line spacing decreases, across at least a portion of the array, as the distance increases. The line spacing may decrease in finite increments as the distance increases. The finite increments may relate to a mask resolution. The line spacing may increase, across at least a portion of the array, as the distance increases. The line spacing may increase in finite increments as the distance increases. The finite increments may relate to a mask resolution. Each pixel may include a first layer positioned between the light sensing portion of the pixel and the optical components. The line spacing may be a function of a refractive index and a thickness of the first layer. The first layer may be a color filter. Each pixel may include a second layer positioned between the light sensing portion of the pixel and the optical components. The line spacing may be a function of a refractive index and a thickness of the second layer. The second layer may be a silicon dioxide layer. Each pixel may include a third layer positioned between the light sensing portion of the pixel and the optical components. The line spacing may be a function of a refractive index and a thickness of the third layer. The third layer comprises a passivation layer. The image capture device may be a mobile telephone. The array may be an array of CMOS sensors.

In still other embodiments, a method of determining a location for each of a plurality of microlenses with respect to each of a plurality of pixels includes providing an image capture device having a focusing lens and a light sensor array comprising the plurality of pixels. Each microlens is configured to focus light on a light-sensing portion of an associated one of the pixels. The method also includes determining a location of each of the microlenses with respect to the light-sensing portion of the associated pixel. Determining a location of each of the microlenses includes determining a location of each of the microlenses with respect to a relative illumination component of the focusing lens as a function of a distance from an optical axis of the focusing lens to the light sensing portion of the pixel that is associated with the microlens.

In some embodiments, the optical axis of the focusing lens is coincident with a normal axis of a plane comprising the plurality of pixels. The image capture device may be a mobile telephone. The array may be an array of CMOS sensors.

In still other embodiments, a method of determining a location for each of a plurality of microlenses with respect to each of a plurality of pixels includes providing an image capture device having a focusing lens and a light sensor array comprising the plurality of pixels. Each microlens is configured to focus light on a light-sensing portion of an associated one of the pixels. The method also includes determining a location of each of the microlenses with respect to the light-sensing portion of the associated pixel. Determining a location of each of the microlenses includes determining a location of each of the microlenses with respect to a principle ray angle as a function of a distance from the pixel associated with the microlens to an optical axis of the focusing lens.

In some embodiments, the image capture device is a mobile telephone. The array may be an array of CMOS sensors. Determining a location of each of the microlenses may include determining a unique location for each microlens relative to each associated pixel.

In still other embodiments, an image capture device includes a focusing lens, a light sensor array comprising a plurality of pixels arranged in a matrix of rows and columns, and a plurality of microlenses. Each microlens is configured to focus light on a light-sensing portion of one of the pixels.

The locations of the microlenses define a grid of parallel and perpendicular lines. A line spacing of the grid varies as a function of a distance from an optical axis of the focusing lens.

In still other embodiments, a method of determining a location for each of a plurality of microlenses with respect to each of a plurality of pixels includes calculating a location for each microlens. The calculated location for at least one particular microlens places the microlens off of a grid of possible locations. The grid of possible locations includes a matrix of locations determined by a resolution increment associated with production equipment. The method also includes revising the location of the particular microlens to be on the grid and providing an image capture device having a focusing lens and an array of pixels comprising the plurality of microlenses. The locations of the microlenses define a grid of parallel and perpendicular lines. A line spacing of the grid varies as a function of a distance from an optical axis of the focusing lens. A line spacing difference from row-to-row and column-to-column is a multiple of the resolution increment.

In some embodiments, the line spacing difference between any two adjacent column pairs is less than or equal to 1 resolution increment. The line spacing difference between any two adjacent row pairs may be less than or equal to 1 resolution increment.

In still other embodiments, a method of determining a location for each of a plurality of color filters with respect to each of a plurality of pixels includes calculating a location for each color filter. The calculated location for at least one particular color filter places the color filter off of a grid of possible locations. The grid of possible locations includes a matrix of locations determined by a resolution increment associated with production equipment. The method also includes revising the location of the particular color filter to be on the grid and providing an image capture device having a focusing lens and an array of pixels comprising the plurality of color filters. The locations of the color filters define a grid of parallel and perpendicular lines. A line spacing of the grid varies as a function of a distance from an optical axis of the focusing lens. A line spacing difference from row-to-row and column-to-column is a multiple of the resolution increment.

In some embodiments, the line spacing difference between any two adjacent column pairs is less than or equal to 1 resolution increment. The line spacing difference between any two adjacent row pairs may be less than or equal to 1 resolution increment.

BRIEF DESCRIPTION OF THE DRAWINGS

A further understanding of the nature and advantages of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Embodiments of the invention provide systems and methods for arranging optical components of image capture devices. An image capture device according to embodiments of the invention may be, for example, digital still cameras, video recorders, I/R devices and the like. Such devices, especially digital still cameras, may be dedicated devices or integral with other electronic devices such as cell phones. In specific embodiments of the present invention, the image capture device is a cell phone camera having a CMOS imaging array.

Optical components include optical sensors, pixels, microlenses, color filters, focusing lenses, and the like. In specific embodiments, a non-telecentric lens is used as the primary focusing lens of a CMOS image sensor integrated with a mobile phone. Photodiodes, located in the pixels of the image sensor pixel array, receive incident light and transmit a corresponding electrical signal to circuitry that quantifies and records the signal. The pixels include color filters to thereby allow a full color image to be captured. Microlenses located atop each pixel improve the signal quality by more efficiently directing the light toward the photodiode.

According to embodiments of the invention, the microlenses and/or color filters are individually placed to optimize the signal created by the incident light. The microlenses and/or filters are arranged with respect to the light sensing portion of the pixel, the focusing lens, and metal lines internal to the pixel, among other things.

Figure 1:
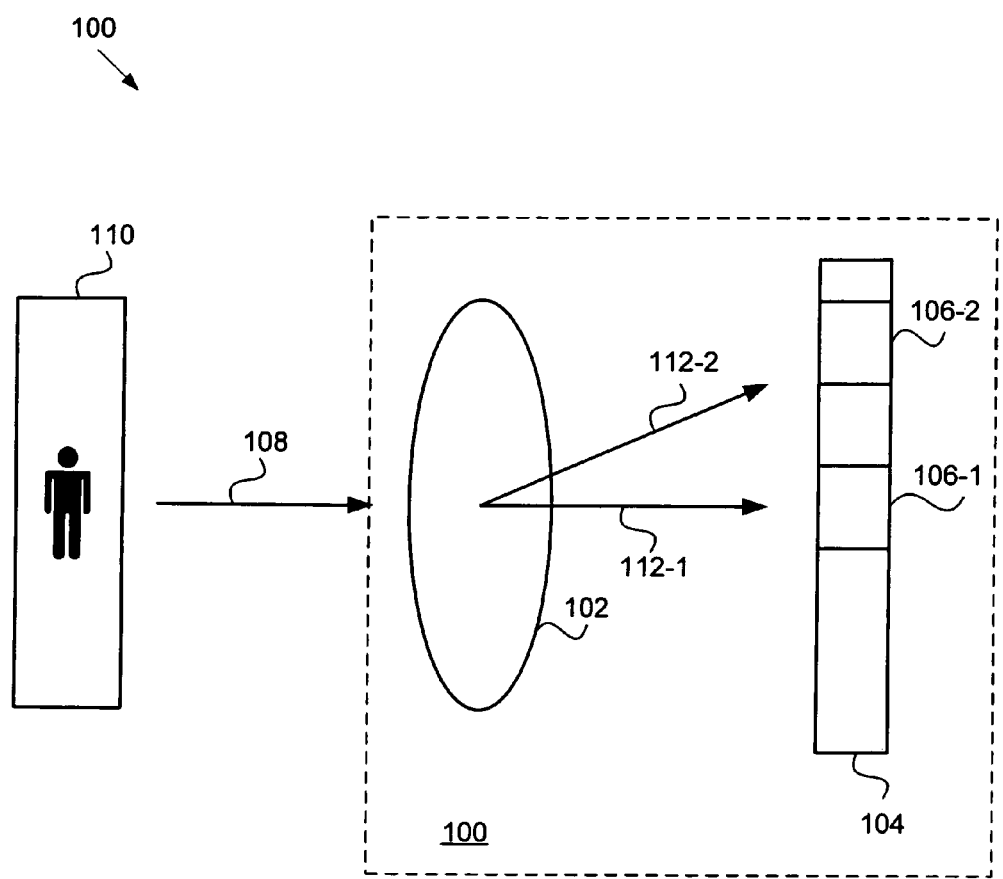
FIG. 1 depicts an image capture device according to embodiments of the invention.

FIG. 1 illustrates an exemplary image capture device 100 according to embodiments of the invention. The device 100 includes a focusing lens 102 and an image sensor array 104. The image sensor array 104 includes a plurality of pixels 106. The focusing lens 102 focuses light 108 emanating from or reflecting from a subject 110 onto the sensor array 104. The light rays 112 focused by the lens 102 are not telecentric. A light ray 112-1 normal to the lens 102 focused on a pixel 106-1 located near the center of the array 104 strikes the pixel 106-1 at an angle normal to the array 104. On the other hand, a ray 112-2 strikes the pixel 106-2 located some radius from the center of the array 104 at an angle less than ninety degrees. Hence, the angle at which a principle ray strikes a pixel is a function of the pixel's radial distance from the point at which the normal ray strikes the plane of the pixel.

Figure 2:
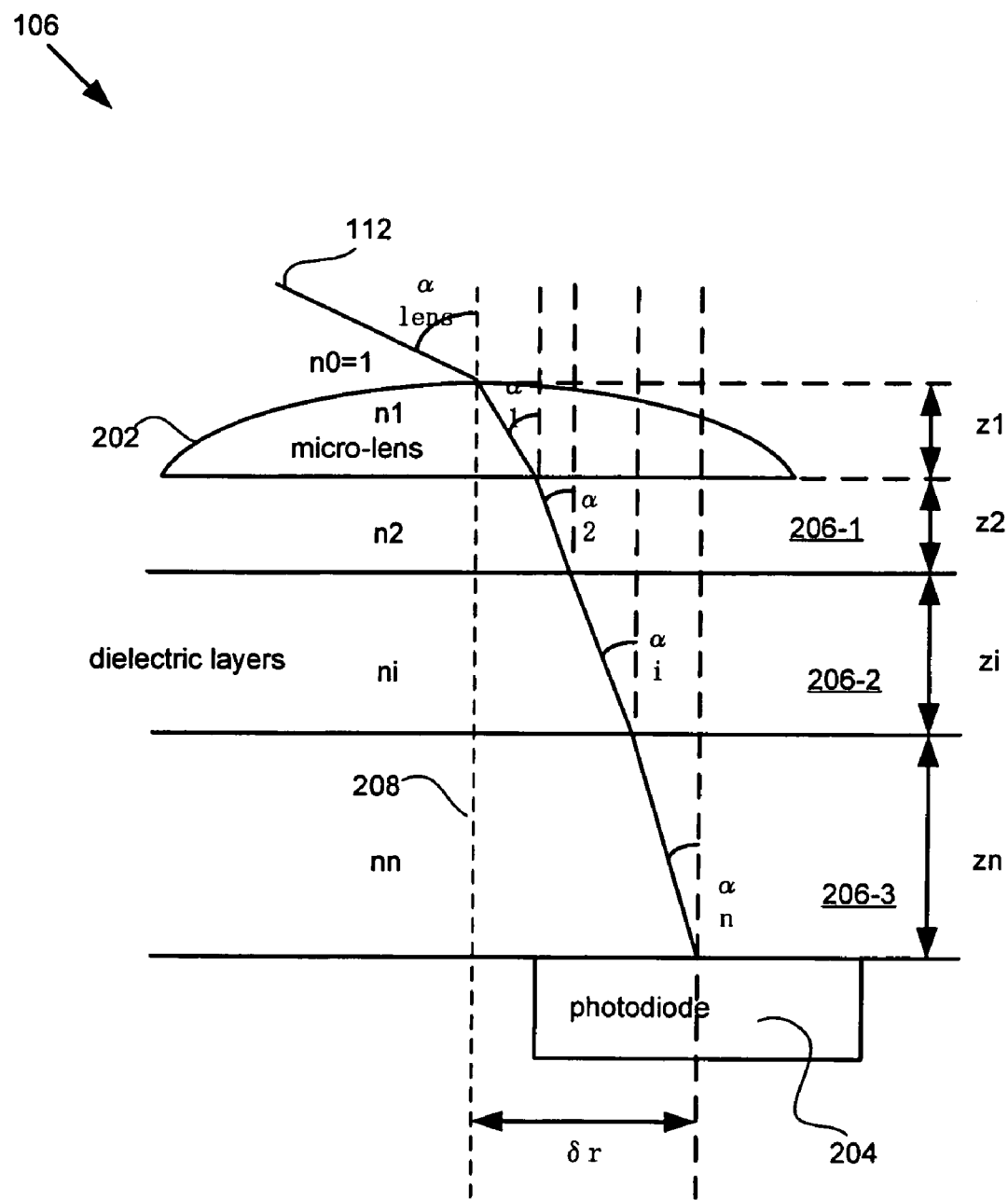
FIG. 2 depicts a schematic representation of a cross-sectional view of a pixel of the imager capture device of FIG. 1.

FIG. 2 is a cross-sectional view of a pixel 106. The pixel 106 includes a microlens 202 that focuses light on a light sensor 204. The light sensor 204 (e.g., photodiode, or the like), is located some distance from the microlens 202, the separation being a result of several layers 206, each having a thickness and a refractive index. Layers may include, for example, one or more of each of the following: color filters, dielectric layers, planarization layers, silicon dioxide layers, passivation layers, and the microlens itself. As the principle ray 112 travels through each layer 206, including the microlens 202, the ray is deflected. The degree of deflection is a function of the thickness of each layer and its refractive index. Hence, δr, the distance the light sensor 204 must be located from the normal axis 208 of the microlens 202, and/or color filter, is given by:

$$\delta r = \sum_{i=1}^{n} z_i \tan(\alpha_i i)$$

Due to the design of the main focusing lens, the foregoing equation is non-linear. The principle angle of the light incident on a pixel is a non-linear function of the radial distance of the pixel from the optical axis. This non-linear equation for locating the pixel optical components with respect to one another may be approximated with a linear equation having the form:

$$\delta r_{lin}(r) = k_\delta \cdot r$$

It then follows that, if the pixels are square with a pitch p, the microlenses and color filters may be placed at a smaller pitch $p_{ml}$ given by:

$$p_{ml} = p \cdot (1 - k_\delta)$$

Placing microlenses with respect to their associated pixels is complicated by at least two different realities. First, the precision with which a microlens may be located may be limited. For example, mask lithography may be limited to hundredths of a pixel's width. In an image sensor array having hundreds of rows and columns, microlenses may not simply be placed at a different, constant pitch with respect to the pixels, since the machine resolution constraints result in excessive gaps and/or overlaps.

In some embodiments, a better approximation of a linear shift is achieved by laying out matrices of pixels. For example, for a pixel pitch of 5 μm, a mask resolution of 10 nm, and a calculated microlens pitch $p_{ml}$=4.9923 μm, the closest microlens pitch permitted by the mask is 4.99 μm. For an array having 400 pixels along half a diagonal, the microlens of the corner pixel will be off by 400*(4.9923−4.99)=0.92 μm. Such variation can lead to severe signal loss (e.g., vigneting) and/or optical cross-talk (e.g., loss of color information) for the corner pixel. To achieve a better approximation, microlenses and color filters may be arranged in matrices. In this example, a 4×4 matrix may include three elements along the diagonal having a dimension of 4.99 μm and a fourth having a dimension of 5.00 μm. Hence, the average pitch for the matrix is (3*4.99+5.00)/4=4.9925 μm, which is significantly closer to the calculated pitch of 4.9923 μm.

Figure 3:
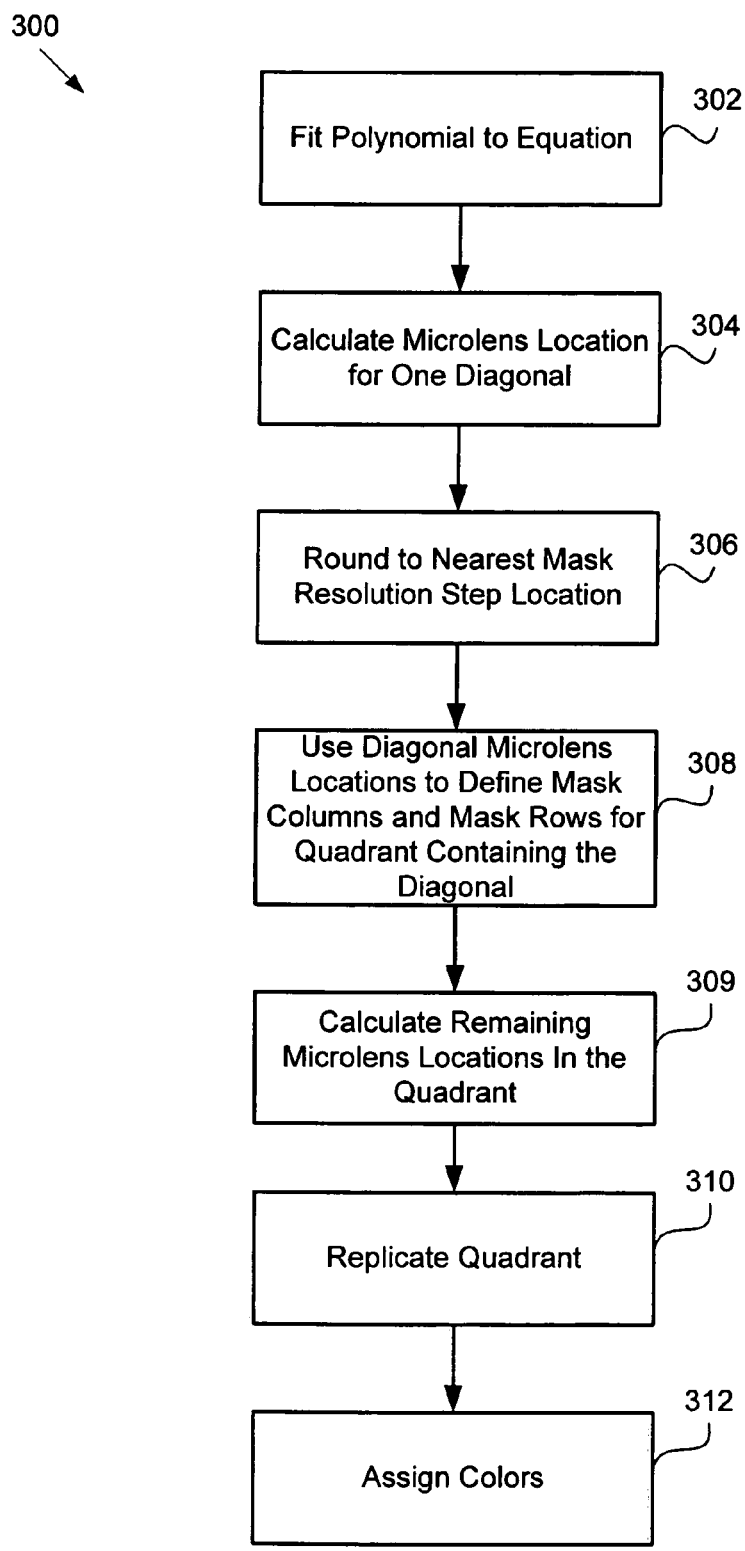
FIG. 3 depicts a first method of placing microlenses with respect to pixels according to embodiments of the invention.
Figure 4:
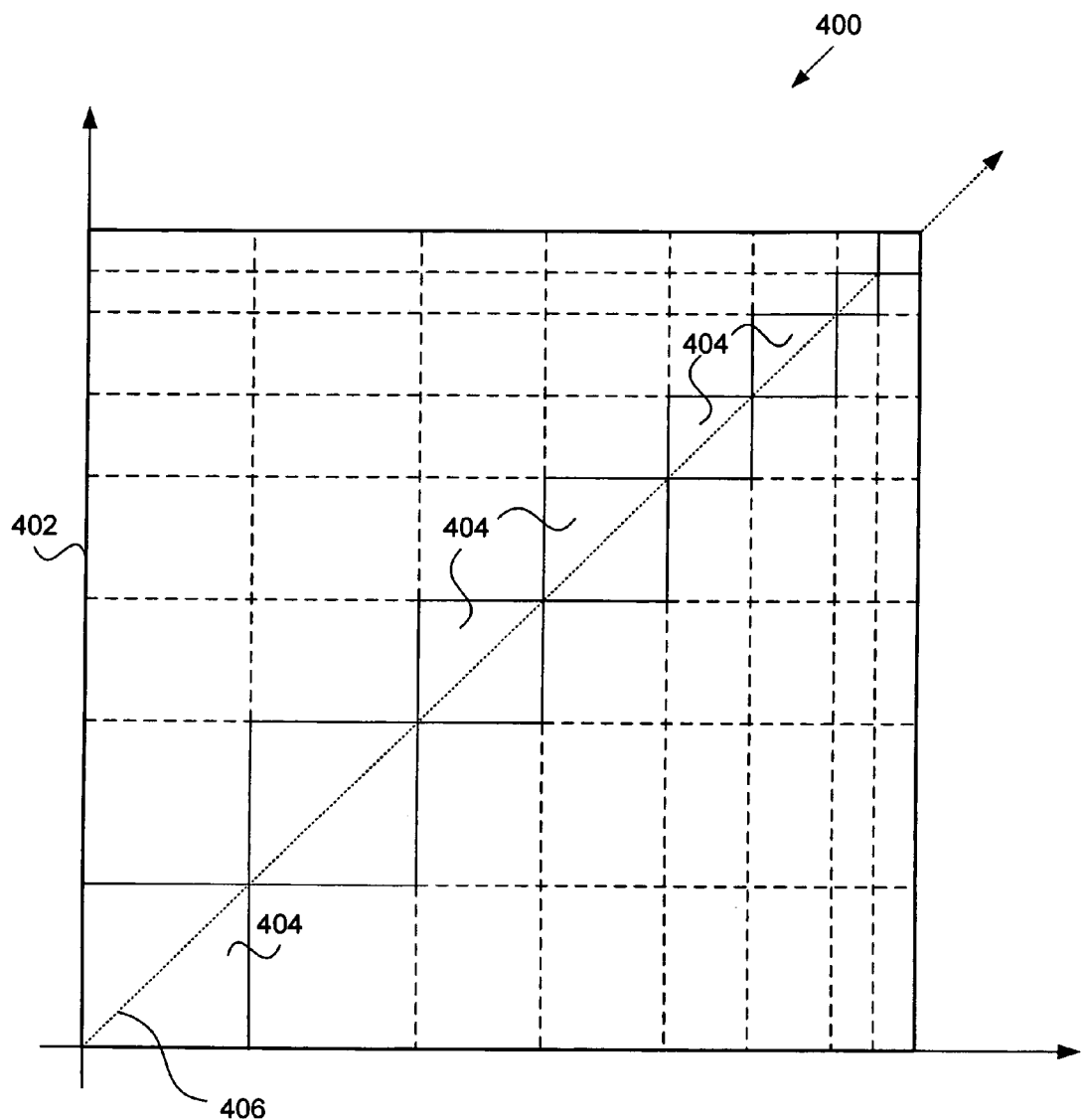
FIG. 4 illustrates a microlens matrix according to embodiments of the invention.

In other embodiments, a piecewise linear approach is used. FIG. 3 illustrates an exemplary method 300 of placing microlenses with respect to pixels, according to such embodiments of the invention. Those skilled in the art will appreciate that the method 300 is merely exemplary and that other methods according to other embodiments may have more, fewer, or different steps than those illustrated and described herein. Further, other methods according to other embodiments may traverse the steps illustrated and described herein in different orders. The method 300 will be described with respect to the pixel array 400 of FIG. 4. FIG. 4 illustrates one quadrant 402 of the array 400, the upper right quadrant in this case.

Microlens and color filter locations are defined by mask patches formed by the horizontal and vertical lines dividing the quadrant 400. Mask patches for color filters generally have no gaps between them, while microlens mask patches typically have gaps with a minimum and a maximum allowable size. The method 300 may be used for either optical component, and although the quadrant 400 appears to apply to color filters since gaps are not shown, those skilled in the art will appreciate that FIG. 4 may apply to either. Due to radial symmetry, mask patches 404 along the diagonal 406 are square, the bottom-left patch being the center of the array. Hence, determining the locations of all mask patches, according to the method 300, becomes a matter of locating the corners of the mask patches along the diagonal. The method begins at block 302, at which a polynomial is fitted to the equation given above that relates br to a pixel's radial distance from the normal principle ray. In a specific embodiment, a third order polynomial is used, which has been determined to provide sufficient approximation in most cases. Many other polynomial orders may be used, however. Hence, the polynomial has the form:

$$\delta r_{poly} = a_0 + a_1 r^2 + a_3 r^3$$

At block 304, microlens mask patches 404 along the diagonal axes 406 are calculated. At block 306, each calculated microlens mask patch border is rounded to the nearest mask resolution step. Due to radial symmetry, the coordinate position of the upper right corner of each mask on the diagonal axis will fall on the axis.

The borders of each microlens mask patch 404 along the diagonal define horizontal and vertical lines. These lines may be extended throughout the array to define the remaining mask patch locations. Hence, at block 308, the borders of the microlens mask patches along the diagonal axis 406 are used to create a grid of horizontal and vertical lines. The lines define the locations of the remaining microlenses mask patches in the array quadrant 402. At block 309, the locations of the microlenses within each patch are calculated. Then at block 310, the quadrant is replicated to the remaining three quadrants of the array. In some embodiments, colors are assigned to pixels at block 312. Those skilled in the art will appreciate that the foregoing is but one exemplary embodiment and will recognize other embodiments in light of this disclosure.

In other embodiments, microlens mask patches are individually located. This may be accomplished by "snapping" the calculated locations of the mask patches to a grid of possible positions determined based on the mask resolution. In some embodiments, as each X and Y coordinate position of a mask patch corner are calculated, the positions are rounded to the nearest mask resolution increment. This may simply include rounding the calculated X and Y coordinate locations to the significant figure that represents the mask resolution. This method works particularly well for mask resolutions in tenths of a significant figure.

Figure 5A:
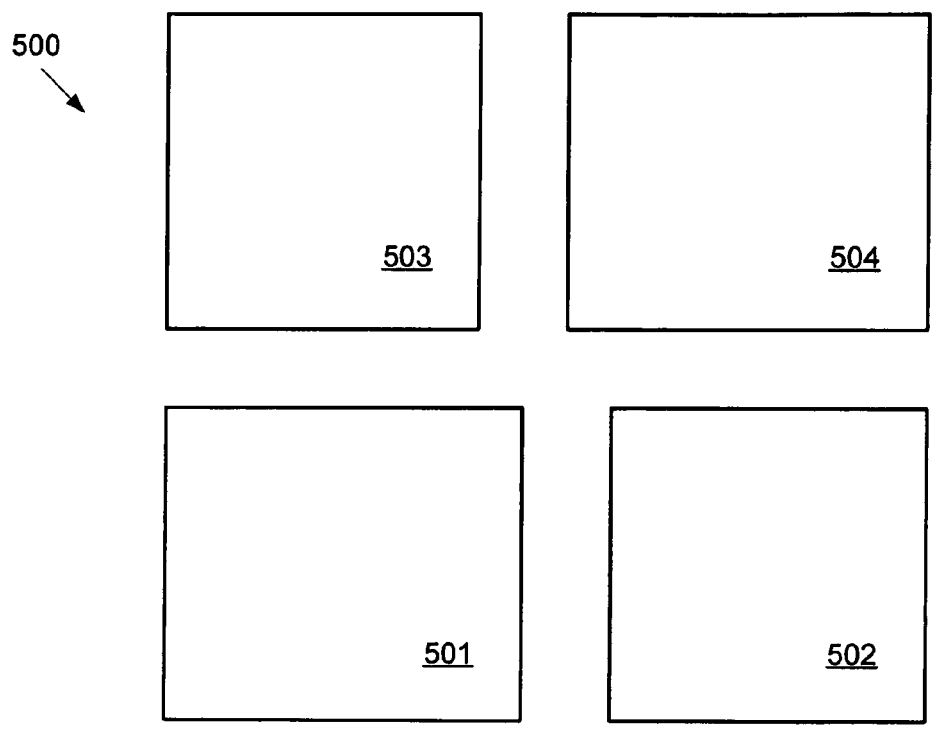
FIGS. 5a and 5b depict microlens mask arrangements according to embodiments of the invention.
Figure 5B:
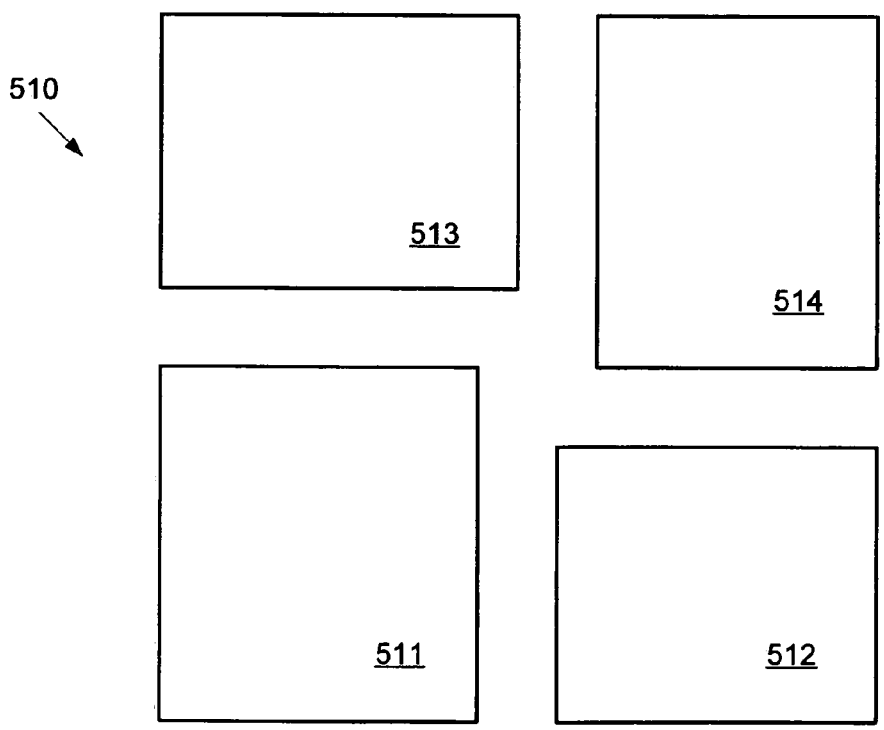

Individually locating mask patches, as opposed to locating them as described above with respect to FIGS. 3 and 4, may require additional considerations. For example, in some embodiments, microlens mask patches have a desired gap size between patches. Simply snapping the patches to the grid may create excessively narrow gaps (or overlaps) or excessively wide gaps. It therefore becomes necessary, in some such embodiments, to identify and correct gap deviations that are out of the acceptable range. FIGS. 5a and 5b illustrate the two possible situations in which gap deviations may need correction. In FIG. 5a, the pitch changes along only one direction. In FIG. 5b, the pitch changes along both directions.

FIG. 5a illustrates a row and column intersection 500 of microlens mask patches appearing as squares 501, 502, 503, and 504 on a microlens mask. In this embodiment, we will assume that the "snapped" location of the mask patch 504 caused it to encroach into the gap between it and the mask patch 503 causing the gap to be too narrow. To accommodate this, the size of the patch 503 is reduced slightly. In other embodiments, however, the size of the mask may remain the same while the gap is reduced on one side or the other to account for the shift, provided, of course, that the minimum and maximum gap size constraints are not violated.

FIG. 5b illustrates a situation in which a shift occurs both along the row and down the column. In this example, the sizes of the patches have been altered so that the gap remains constant.

Figure 6:
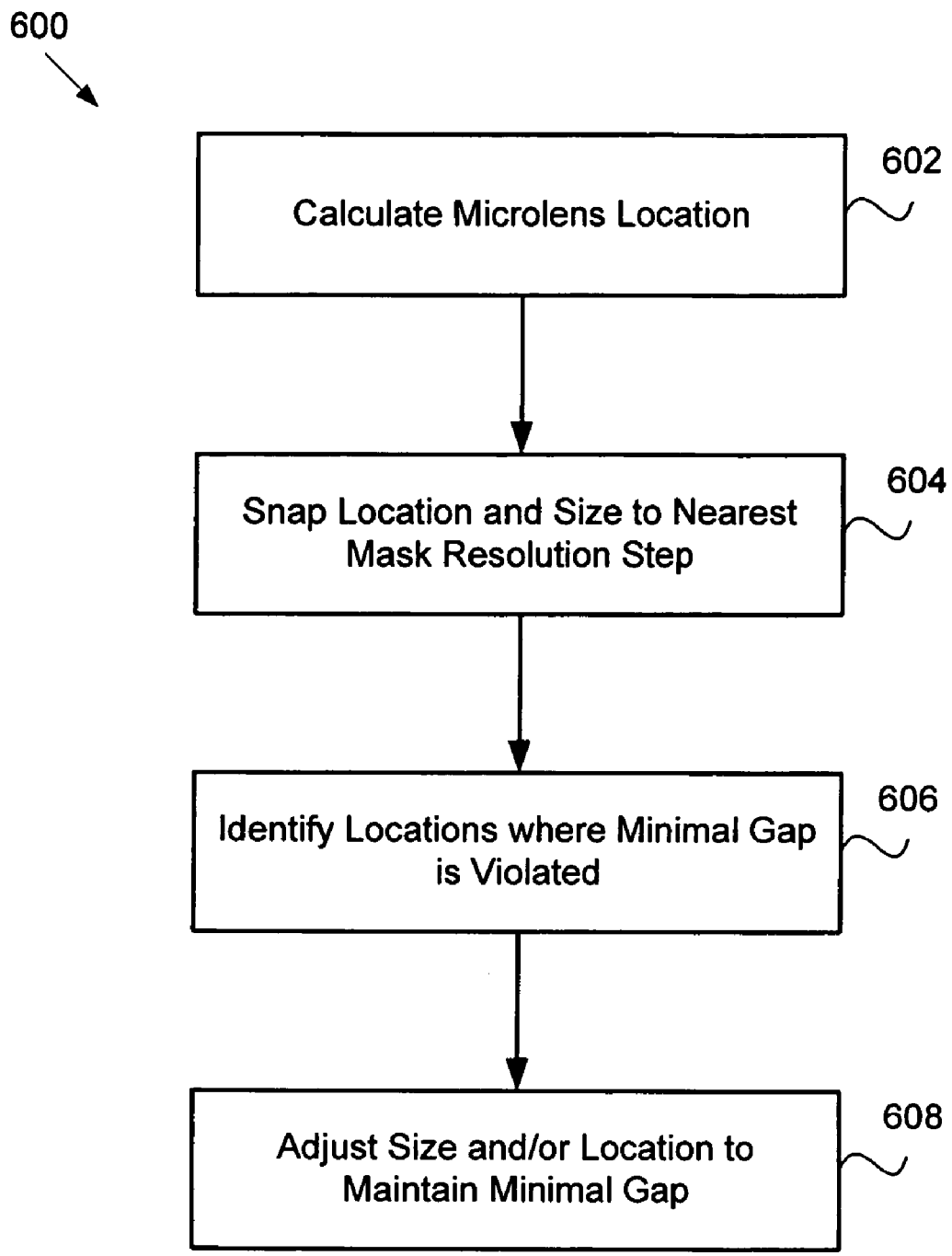
FIG. 6 depicts a method of placing microlenses according to embodiments of the invention.

FIG. 6 illustrates an exemplary method 600 of determining the microlens mask patch locations of FIGS. 5a and 5b according to embodiments of the invention. At step 602, the location of each microlens patch is calculated using any of the previously-discussed equations for doing so. This may be accomplished, for example, by calculating the horizontal and vertical borders of each patch based on an ideal mask patch size. It should be pointed out that the calculated location may account for other factors, such as shading, as will be described with respect to FIGS. 9 and 10.

At block 604, the microlens patch border locations are "snapped" to the nearest mask resolution increment. This may be accomplished by simply rounding to the nearest mask resolution multiple. A pre-determined offset may be added if the starting point is taken to be some location other than the exact center of the array.

In some cases, however, the final mask patch borders determined at block 604 results in a gap of unacceptable width, either too large or too small. Hence, at block 606, column and row intersections are identified at which transitions occur that cause an unacceptable gap. Then at block 608, mask patch borders are altered to maintain the proper gap size. In a specific embodiment, this includes identifying the border nearest a mask resolution increment to which the border could be relocated to maintain the desired gap size. In some embodiments, this includes maintaining constraints on the size of the resulting mask patch. Thos skilled in the art will appreciate may additional ways for accomplishing this in light of this disclosure.

Figure 7A:
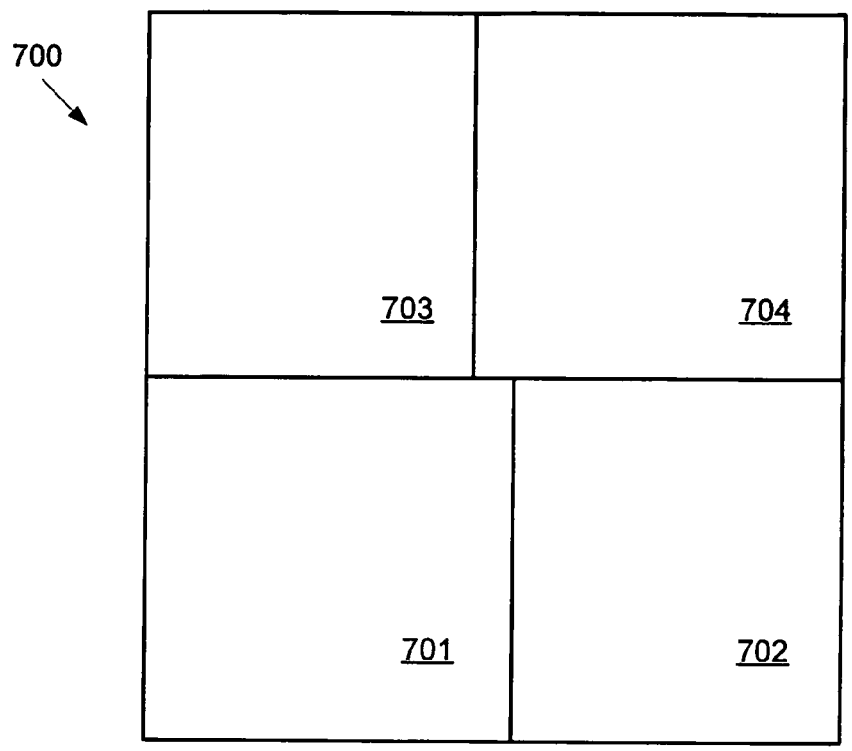
FIGS. 7a and 7b depict filter mask arrangements according to embodiments of the invention.
Figure 7B:

A similar process may be performed on mask patches used to create filters, such as color filters. Unlike microlens mask patches, however, filter mask patches typically are gapless and snapping their locations to the mask resolution grip will result in gaps and overlaps, both of which must be corrected. Unlike microlens patches, however, filter mask patches need not be rectangular. FIGS. 7a and 7b illustrate the two possible column and row intersections that may occur in the placement of filters mask patches. The example of FIG. 7a depicts a situation 700 in which a column border transitions by one mask resolution step. Color filters 702 and 703 are reduced in size to maintain the outer border of the region. No gaps or overlaps occur.

FIG. 7b illustrates a situation 710 in which both a column and a row transition by one mask resolution step. In this situation, however, an overlap would occur at the intersection. In this embodiment, the filter patch 711 is altered to eliminate the overlap. The filter selected to be irregular may be the one having its border in the transition region closest to the mask resolution increment. The decision also may be made based on color. Other embodiments are possible.

Figure 8:
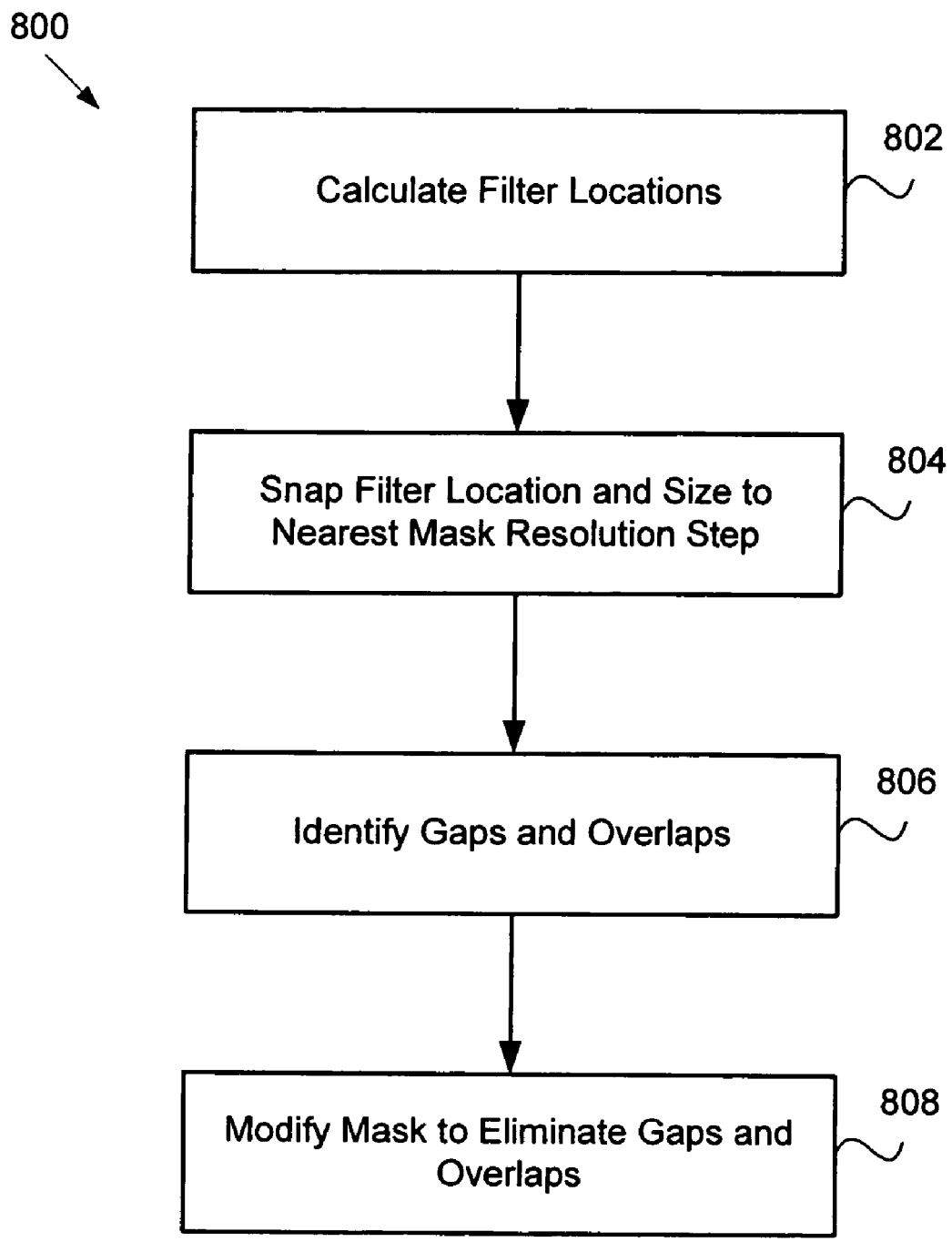
FIG. 8 depicts a method of placing color filters according to embodiments of the invention.

FIG. 8 depicts an exemplary method 800 for placing filter mask patches according to embodiments of the invention. The method begins at block 802 at which point filter mask locations are calculated using any of the previously-discussed equations for doing so. At block 804, filter borders not coincident with a mask resolution increment are "snapped" to the nearest mask resolution increment. This is similar to the step 604 for snapping the border locations of the microlens mask patches described previously. For example, this may be accomplished by rounding the horizontal and vertical border location to the nearest mask resolution increment. Doing so, however, may create gaps and/or overlaps, which may be unacceptable. Hence, at block 806 gaps and overlaps are identified. Once gaps and overlaps are identified, at block 808 the filter mask borders on either side of gaps may be expanded to the mask resolution increment in the gap, if a mask resolution increment is located in the gap. Otherwise, both borders are relocated to the mask resolution increment having the smallest cumulative difference. If the difference is the same, then either mask resolution increment may be chosen. Or, a border may be chosen to avoid a situation as in FIG. 7b in which both a column and row transition at the same intersection. Many possibilities exist for properly adjusting the borders. For overlaps, the overlap region is assigned to one of the overlapping filters. In some embodiments, the overlap region is assigned to the filter for which the overlap region represents the smallest percentage increase in size. In some embodiments, the overlap region is assigned based on color. In still other embodiments, the overlap region is assigned using a combination of the two. Many other examples are possible.

As mentioned previously, a microlens' calculated location may be further adjusted due to shading. Shading is the difference of signal level between the pixels that are situated at different geometrical positions of the sensor. Shading originates from many factors. For example, characteristics of the main focusing lens 102, metal wiring in the pixel itself, and/or the like contribute shading.

Figure 9:
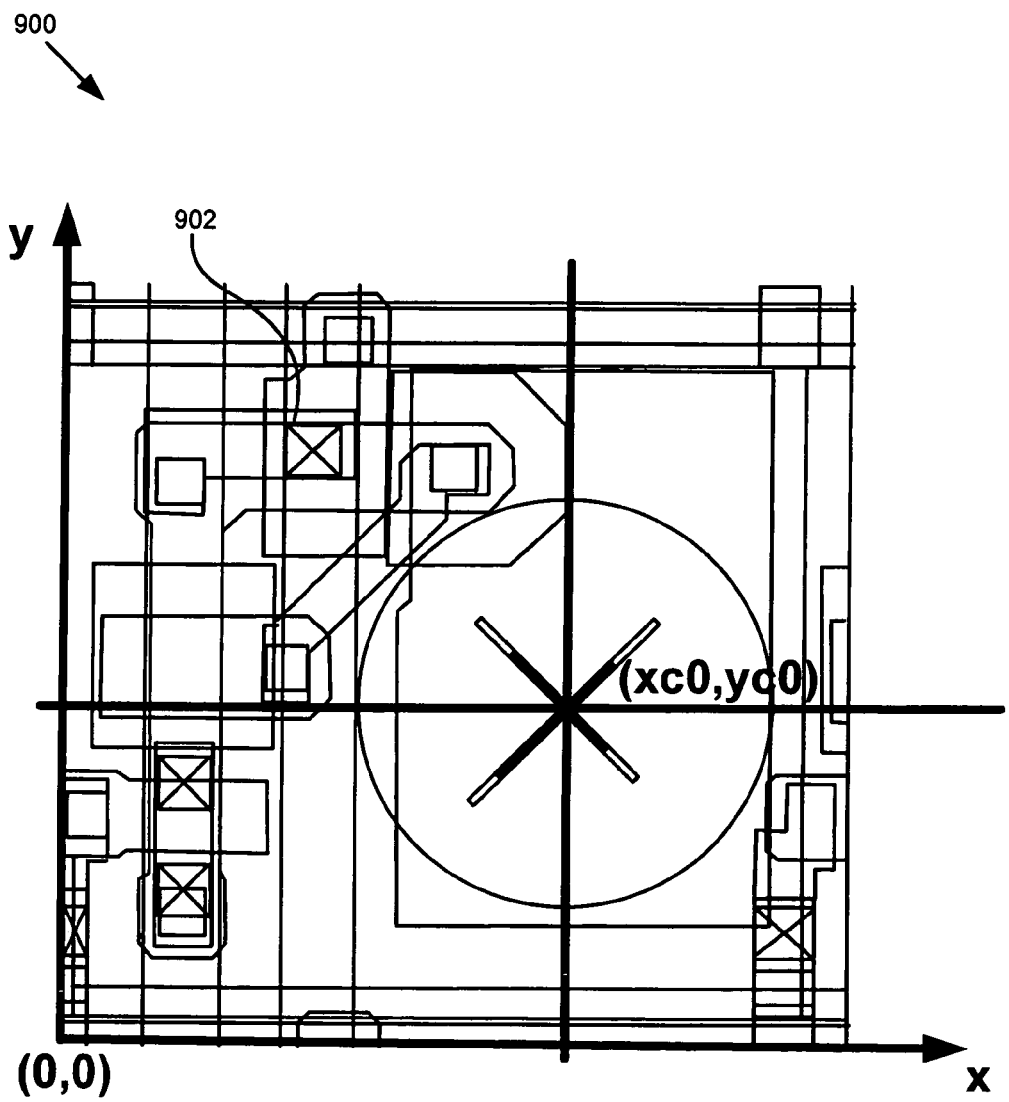
FIG. 9 depicts a pixel of the image capture device of FIG. 1.

FIG. 9 illustrates a pixel 900 according to embodiments of the invention. The pixel includes metal wiring 902 that at least partially obscures the light-sensing region 912 at a lower depth of the pixel shown in the cross-sectional view of the pixel in FIG. 10.

According to some embodiments of the invention, the microlens 102 is located such that the spot it casts falls within the largest circle that can be inscribed in the pixel without ensnaring metal wiring 902. In some embodiments, the center of the spot is made to fall on the center of the inscribed circle. In other embodiments, the center of the spot is made to fall on the center of sensitivity of the light sensing region. Other examples exist and are apparent to those skilled in the art. In some embodiments, the microlens' curvature, a controllable parameter, is adjusted to change the size of the spot. In fact, in some embodiments, the curvature of each microlens is a function of its radial distance from the center of the array.

Figure 10:
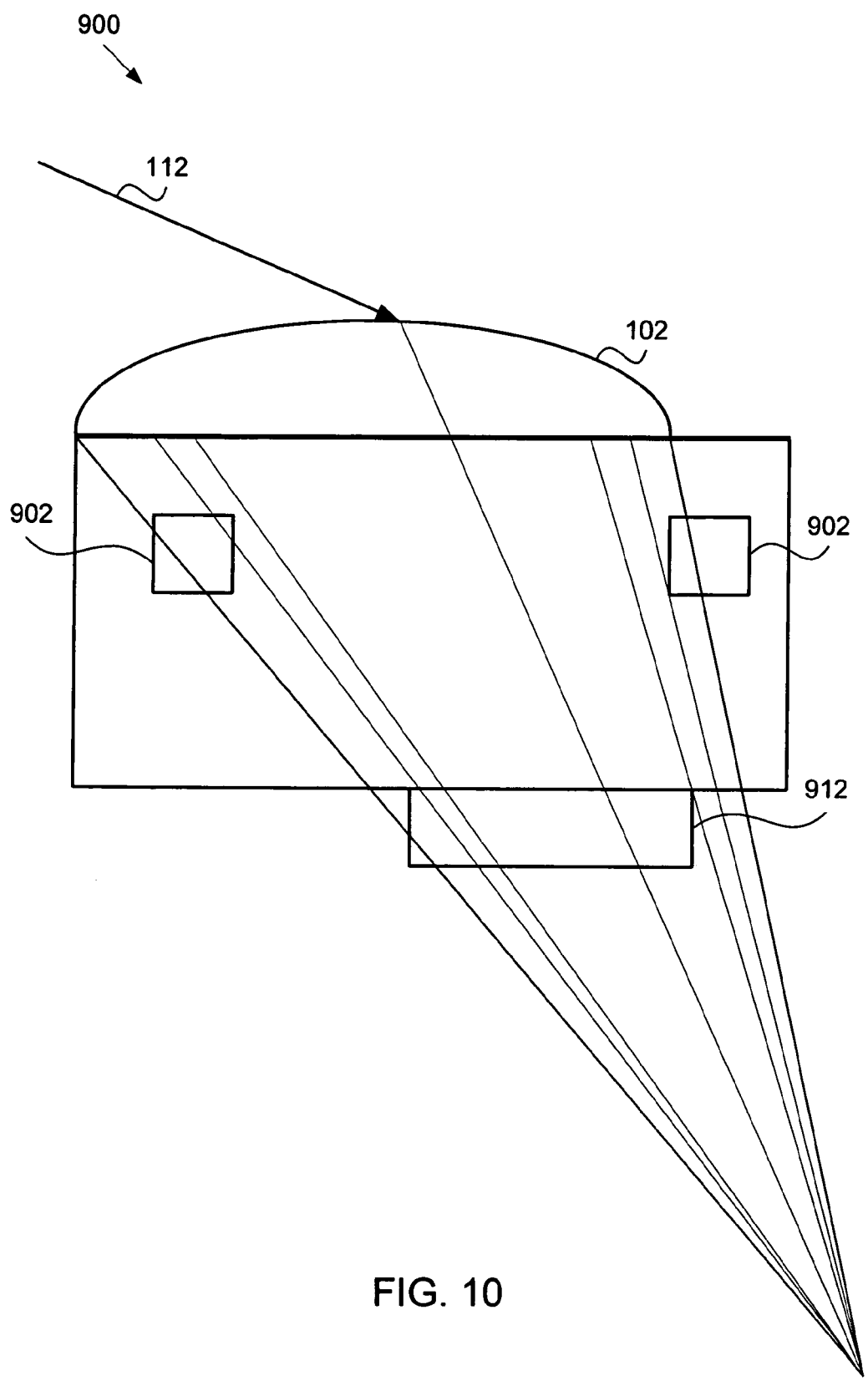
FIG. 10 depicts a cross-sectional view of the pixel of FIG. 9.

It should be apparent, however, with reference to FIGS. 9 and 10 that the microlens 102 is not necessarily, physically located at the center of the largest circle due to the depth of the pixel and the angle of the principle ray. The physical positioning of the pixel should account for the vertical and lateral placement of the light sensing region of the pixel with respect to the microlens and the location in the pixel volume itself of the metal lines.

The foregoing may be embodied in the following equations, the derivation of which may be found in previously-incorporated U.S. Provisional Patent Application No. 60/608,972, wherein $x_{cml}$ and $y_{cml}$ are the x and y coordinates of the center of the microlens, x and y are the coordinates of the corner of the pixel (shown as (0,0) in FIG. 9), and δr(r) is the function describing the required deviation relative to the pixel:

$$x_{cml} = x - \frac{x \cdot \delta r(r)}{\sqrt{x^2 + y^2}}; \quad y_{cml} = y - \frac{y \cdot \delta r(r)}{\sqrt{x^2 + y^2}}.$$

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention, which is defined in the following claims.

What is claimed is:

1. A method of determining a location for each of a plurality of microlenses with respect to each of a plurality of pixels, the method comprising:
   providing an image capture device having a focusing lens and a light sensor array comprising the plurality of pixels, wherein each microlems is configured to focus light on a light-sensing portion of an associated one of the pixels; and
   determining a location of each of the microlenses with respect to the light-sensing portion of the associated pixel;
   wherein determining a location of each of the microlenses includes determining a location of each of the microlenses with respect to a relative illumination component of the focusing lens as a function of a distance from an optical axis of the focusing lens to the light sensing portion of the pixel that is associated with the microlens.

2. The method of claim 1, wherein the optical axis of the focusing lens is coincident with a normal axis of a plane comprising the plurality of pixels.

3. The method of claim 1, wherein the image capture device comprises a mobile telephone.

4. The method of claim 1, wherein the array comprises an array of CMOS sensors.

5. A machine-readable medium having machine-executable instructions for performing the machine-implementable method for determining a location for each of a plurality of microlenses with respect to each of a plurality of pixels of claim 1.

6. A machine adapted to perform the machine-implementable method for determining a location for each of a plurality of microlenses with respect to each of a plurality of pixels of claim 1.

7. A method of determining a location for each of a plurality of microlenses with respect to each of a plurality of pixels, the method comprising:
   providing an image capture device having a focusing lens and a light sensor array comprising the plurality of pixels, wherein each microlens is configured to focus light on a light-sensing portion of an associated one of the pixels; and
   determining a location of each of the microlenses with respect to the light-sensing portion of the associated pixel;
   wherein determining a location of each of the microlenses includes determining a location of each of the microlenses with respect to a principle ray angle as a function of a distance from the pixel associated with the microlens to an optical axis of the focusing lens.

8. The method of claim 7, wherein the image capture device comprises a mobile telephone.

9. The method of claim 7, wherein the ray comprises an array of CMOS sensors.

10. The method of claim 7, wherein determining a location of each of the microlenses comprises determining a unique location for each microlens relative to each associated pixel.

11. A machine-readable medium having machine-executable instructions for performing the machine-implementable method for determining a location for each of a plurality of microlenses with respect to each of a plurality of pixels of claim 1.

12. A machine adapted to perform the machine-implementable method for determining a location for each of a plurality of microlenses with respect to each of a plurality of pixels of claim 1.

13. A method of determining a location for each of a plurality of microlenses with respect to each of a plurality of pixels, the method comprising:
   calculating a location for each microlens, wherein the calculated location for at least one particular microlens places the microlens off of a grid of possible locations, wherein the grid of possible locations comprises a matrix of locations determined by a mask resolution increment associated with production equipment;
   revising the location of the particular microlens to be on the grid; and
   providing an image capture device having a focusing lens and an array of pixels comprising the plurality of microlenses, whereby the locations of the microlenses define a grid of parallel and perpendicular lines, wherein a line spacing of the grid varies as a function of a distance from an optical axis of the focusing lens, wherein a line spacing difference from row-to-row and column-to-column is a multiple of the mask resolution increment, and wherein a line spacing difference between at least two adjacent pairs of grid lines differs by a single mask resolution increment.

14. The method of claim 13, wherein the line spacing difference between any two adjacent column pairs is less than or equal to 1 resolution increment.

15. The method of claim 13, wherein the line spacing difference between any two adjacent row pairs is less than or equal to 1 resolution increment.

16. A machine-readable medium having machine-executable instructions for performing the machine-implementable method for determining a location for each of a plurality of microlenses with respect to each of a plurality of pixels of claim 13.

17. A machine adapted to perform the machine-implementable method for determining a location for each of a plurality of microlenses with respect to each of a plurality of pixels of claim 13.

18. A method of determining a location for each of a plurality of color filters with respect to each of a plurality of pixels, the method comprising:

calculating a location for each color filter, wherein the calculated location for at least one particular color filter places the color filter off of a grid of possible locations, wherein the grid of possible locations comprises a matrix of locations determined by a mask resolution increment associated with production equipment;

revising the location of the particular color filter to be on the grid; and providing an image capture device having a focusing lens and an array of pixels comprising the plurality of color filters, whereby the locations of the color filters define a grid of parallel and perpendicular lines, wherein a line spacing of the grid varies as a function of a distance from an optical axis of the focusing lens, wherein a line spacing difference from row-to-row and column-to-column is a multiple of the mask resolution increment, and wherein a line spacing difference between at least two adjacent pairs of end lines differs by a single mask resolution increment.

19. The method of claim 18, wherein the line spacing difference between any two adjacent column pairs is less than or equal to 1 resolution increment.

20. The method of claim 18, wherein the line spacing difference between any two adjacent row pairs is less than or equal to 1 resolution increment.

21. A machine-readable medium having machine-executable instructions for performing the machine-implementable method for determining a location for each of a plurality of color filters with respect to each of a plurality of pixels of claim 18.

22. A machine adapted to perform the machine-implementable method for determining a location for each of a plurality of color filters with respect to each of a plurality of pixels of claim 18.

* * * * *